US011953533B2

United States Patent
Stoica et al.

(10) Patent No.: US 11,953,533 B2
(45) Date of Patent: Apr. 9, 2024

(54) DETECTING CAPACITIVE FAULTS AND SENSITIVITY FAULTS IN CAPACITIVE SENSORS

(71) Applicant: Infineon Technologies AG, Neubiberg (DE)

(72) Inventors: Dan-Ioan-Dumitru Stoica, Bucharest (RO); Cesare Buffa, Villach (AT); Constantin Crisu, Bucharest (RO); Mihai-Liviu Tudose, Bucharest (RO); Bernhard Winkler, Regensburg (DE)

(73) Assignee: Capital One Services, LLC, McLean, VA (US)

( * ) Notice: Subject to any disclaimer, the term of this patent is extended or adjusted under 35 U.S.C. 154(b) by 82 days.

(21) Appl. No.: 17/347,776

(22) Filed: Jun. 15, 2021

(65) Prior Publication Data
US 2022/0397593 A1    Dec. 15, 2022

(51) Int. Cl.
*G01R 31/28*  (2006.01)
*G01R 27/26*  (2006.01)
*G01R 27/28*  (2006.01)

(52) U.S. Cl.
CPC ......... *G01R 27/2605* (2013.01); *G01R 27/28* (2013.01); *G01R 31/2843* (2013.01)

(58) Field of Classification Search
CPC .... G01R 27/2605; G01R 27/26; G01R 27/28; G01R 31/2843; G01R 31/28; G01R 31/64; G01D 18/00; G01D 5/24
See application file for complete search history.

(56) References Cited

U.S. PATENT DOCUMENTS

| 2015/0110295 A1* | 4/2015 | Jenkner .................. H04R 3/00 381/114 |
| 2016/0011254 A1* | 1/2016 | Maeda ............... G01R 31/2829 324/538 |
| 2016/0202286 A1* | 7/2016 | Aaltonen ............... G01D 18/00 73/1.38 |

FOREIGN PATENT DOCUMENTS

EP    2317328 A2 *  5/2011   ......... G01C 19/5719

* cited by examiner

*Primary Examiner* — Tarun Sinha
*Assistant Examiner* — James I Burris
(74) *Attorney, Agent, or Firm* — Harrity & Harrity, LLP

(57) ABSTRACT

A capacitive sensor includes a first conductive structure; a second conductive structure that is counter to the first conductive structure, wherein the second conductive structure is movable relative to the first conductive structure in response to an external force acting thereon, wherein the second conductive structure is capacitively coupled to the first conductive structure to form a first capacitor having a first capacitance that changes with a change in a distance between the first conductive structure and second conductive structure; a signal generator configured to apply a first electrical signal step at an input or at an output of the first capacitor to induce a first voltage transient response at the output of first capacitor; and a diagnostic circuit configured to detect a fault in the capacitive sensor by measuring a first time constant of the first voltage transient response and detecting the fault based on the first time constant.

22 Claims, 8 Drawing Sheets

DETECTING CAPACITIVE FAULTS AND SENSITIVITY FAULTS IN CAPACITIVE SENSORS

BACKGROUND

Capacitive sensors have many applications and may be used as pressure sensors, acoustic sensors, microphone sensors, and the like. A capacitive sensor may be a microelectromechanical system (MEMS) capacitive sensor in any of the aforementioned applications.

Capacitive faults are known failure modes in capacitive sensors. For example, when the membrane of the capacitive sensor is broken, when a conductive particle comes in between the conductive back-plates of the capacitive sensor, or when water is present between the conductive back-plates. Sensitivity faults may also occur due to water being present between the conductive back-plates, a weaking (i.e., a softening) of the membrane, or when water accidentally fills the space between the back-plates. In both cases, the sensor functionality can be impaired via a change in the desired sensor sensitivity and/or increased noise level. The capacitive faults described above can result in a change in capacitance of the capacitive sensor and/or a change in the voltage dependency of the capacitance (i.e., the sensor sensitivity).

Therefore, an improved device capable of detecting and diagnosis of capacitive and sensitivity faults in capacitive sensors may be desirable.

SUMMARY

Embodiments provide a capacitive sensor including a first conductive structure; a second conductive structure that is counter to the first conductive structure, wherein the second conductive structure is movable relative to the first conductive structure in response to an external force acting thereon, wherein the second conductive structure is capacitively coupled to the first conductive structure to form a first capacitor having a first capacitance that changes with a change in a distance between the first conductive structure and second conductive structure, wherein the first capacitance is representative of the external force; a signal generator configured to apply a first electrical signal step at an input or at an output of the first capacitor to induce a first voltage transient response at the output of first capacitor; and a diagnostic circuit configured to detect a fault in the capacitive sensor by measuring a first time constant of the first voltage transient response and detecting the fault based on the first time constant.

Embodiments provide a capacitive sensor including a first conductive structure; a second conductive structure that is counter to the first conductive structure, wherein the second conductive structure is movable relative to the first conductive structure, wherein the second conductive structure is capacitively coupled to the first conductive structure to form a first capacitor having a first capacitance that changes with a change in a distance between the first conductive structure and second conductive structure, wherein the first capacitor includes a first terminal coupled to a bias supply voltage and a second terminal coupled to a first DC voltage set by a bias resistive circuit; a third conductive structure that is counter to the first conductive structure, wherein the third conductive structure is movable relative to the first conductive structure, wherein the third conductive structure is capacitively coupled to the first conductive structure to form a second capacitor having a second capacitance that changes with a change in a distance between the first conductive structure and third conductive structure, wherein the second capacitor includes a first terminal coupled to the bias supply voltage and a second terminal coupled to a second DC voltage set by the bias resistive circuit; a common mode buffer configured to receive the first DC voltage, the second DC voltage, and a reference voltage, and generate a differential signal based on a difference between a common mode voltage of the first DC voltage and the second DC voltage and the reference voltage; a signal generator configured to apply a first electrical signal step at an input or at an output of the first capacitor and at an input or at an output of the second capacitor to induce a first voltage transient response in the first DC voltage and to induce a second voltage transient response in the second DC voltage, respectively; and diagnostic circuit configured to detect a fault in the capacitive sensor by measuring a first time constant of the differential signal that corresponds to the first and the second voltage transient responses and detect the fault based on the first time constant.

BRIEF DESCRIPTION OF THE DRAWINGS

Embodiments are described herein making reference to the appended drawings.

DETAILED DESCRIPTION

Figure 1:
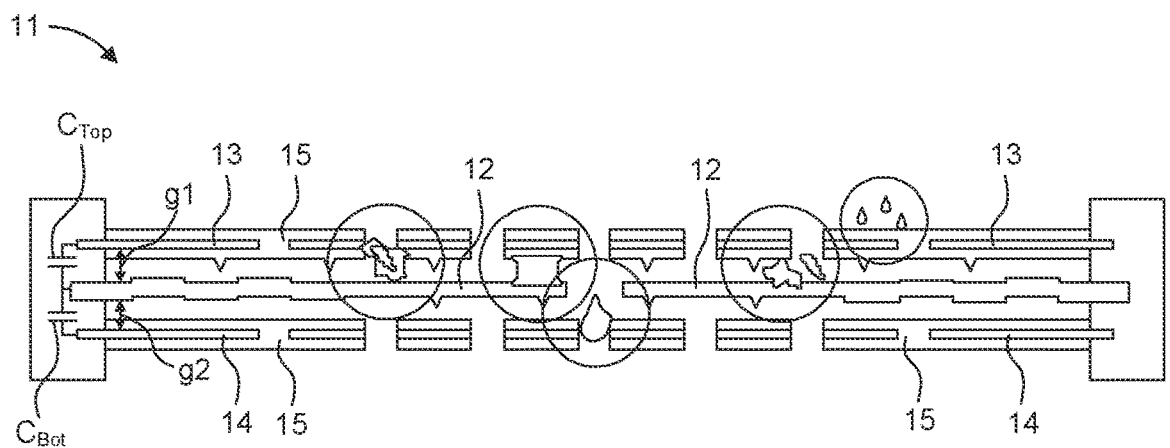
FIG. 1 shows a cross-section view of a MEMS element of a capacitive sensor according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Embodiments are directed to the diagnosis of electrical failures in capacitive sensors, and more precisely the diagnosis of capacitive and sensitivity faults in micro-electromechanical system (MEMS) capacitive sensors, which are some of the critical failure modes of this device. The diagnosis may be applied any capacitive sensor, including single capacitive sensors or those that use two capacitors (e.g., a top capacitor $C_{Top}$ and a bottom capacitor $C_{Bot}$) for sensing and generating measurements signals representative of the physical quantity (e.g., pressure, acoustic waves, vibrations, or any other alternating current (AC) external force) being measured by the capacitive sensor.

The diagnostic circuit performs its diagnosis by measuring some selected electrical parameter of the MEMS capacitive sensor, such as a one or more time constants thereof, and then supplies this information as an output diagnosis. Capacitive or sensitivity fault, if present, will result either in a shift in one or more of the time constants that exceeds a tolerance range or threshold. The diagnostic circuit is configured to measure time constants, and, once they exceed a tolerance range supply this information as an output diagnosis (e.g., as a fault indicator).

FIG. 1 shows cross-section views of a MEMS element of a capacitive sensor according to one or more embodiments. In particular, FIG. 1 shows a MEMS element 11 of a dual backplate capacitive sensor that may be implemented as a MEMS microphone, but the embodiments are not limited thereto. For example, MEMS capacitive sensors may also be used as pressure sensors.

The MEMS element 11 of the dual backplate capacitive sensor includes three electrodes, including one conductive membrane 12 and two conductive back-plates 13 and 14. The membrane 12 is movable and the two conductive back-plates 13 and 14 may be movably fixed in a stationary position. In other embodiments, one or more of the back-plates 13 and 14 may also be movable.

A top capacitor CTop is formed between the top back-plate 13 and the membrane 12 and a bottom capacitor CBot is formed between the bottom back-plate 14 and the membrane 12. As the distance (i.e., thickness of gap g1 or g2) between respective electrodes changes in response to an external force (e.g., pressure or acoustic waves (sound)) applied to the movable conductive structure (e.g., the membrane 12), the capacitance of each capacitor CTop and CBot changes. For example, capacitance is calculated according to the formula Q=CV, where Q is the charge in coulombs, C is the capacitance in farads, and V is the potential difference between the electrodes of the capacitor in volts.

Different types of read-out circuits may be used to measure the change in capacitance. For example, a read-out circuit may utilize constant change readout during which the voltage V is measured while the charge Q is held constant. The change in capacitance caused by the thickness of gaps g1 and g2 changing causes the voltages Vtop and Vbot stored across the capacitors to change, and a measurement circuit may measure these voltages as sensor signals. Specifically, the voltage across each capacitor CTop and CBot represents a sensor signal that can be measured by a readout circuit and correlated into a physical quantity such as pressure or acoustic waves (sound). Thus, the voltage is the variable to be measured. Each capacitor may be read out independently or a common mode buffer may be used to read out an averaged value of the capacitors.

In the present example, the membrane 12 may move closer to one back-plate as it moves further from the other back-plate, thereby changing the capacitance of each capacitor CTop and CBot. The movement of the membrane 12 is cause by an external force (e.g., pressure or acoustic waves (sound), or vibration) applied to the membrane 12. These external forces are oscillating or AC external forces that that changes in polarity or direction over time.

It will also be appreciated that the embodiments are not limited to dual backplate capacitive sensors but may also apply to single capacitor sensors consisting of two electrodes or capacitive sensors with two or more capacitors, including dual capacitive sensors where the two outside electrodes are movable and the middle electrode is movably fixed. Regardless of the type of capacitive sensor, at least two electrodes are used to form at least one capacitor. Each capacitor is thereby formed by two electrodes, at least one of which is moveable relative to the other in response to an external force being applied thereto. One electrode of a capacitor may be referred to as a reference electrode, whereas the other electrode of a capacitor may be referred to as a counter electrode.

An isolation material 15 is also provided to provide electrical isolation between the conductive elements 12, 13, and 14.

Conductive materials such as metal particles or water droplets may penetrate the MEMS element 11 and form a conductive path (e.g., a short) between otherwise electrically isolated portions of the MEMS element 11. The unwanted conductive path may negatively impact the performance of the MEMS element 11. Capacitive and/or sensitivity faults may also be caused by internal defects within the integrated circuit itself that may develop over the lifetime of the device. The following embodiments provide additional readout circuitry used to detect capacitive and/or sensitivity faults and possibly compensate for the detected faults to restore or otherwise improve the functionality of the capacitive sensor.

Figure 2:
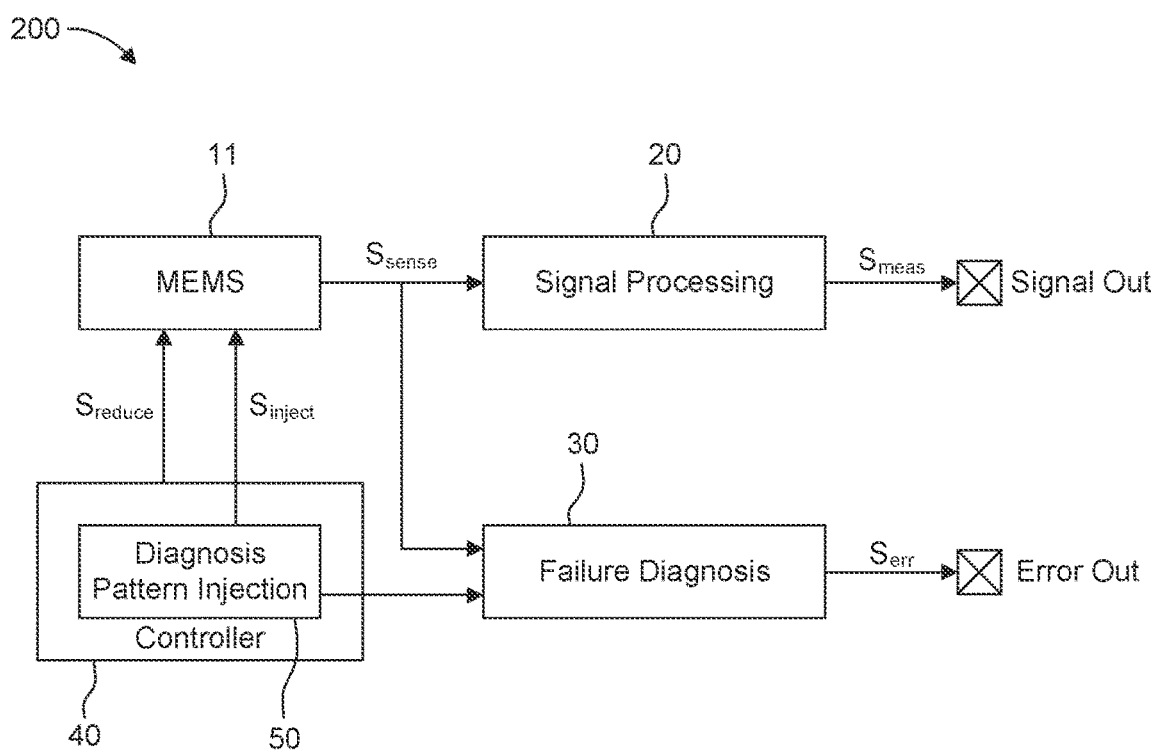
FIG. 2 is a block diagram of a capacitive sensor according to one or more embodiments.

FIG. 2 is a block diagram of a capacitive sensor 200 according to one or more embodiments. The capacitive sensor 200 includes MEMS element 11 and a signal processing circuit 20 that is configured to receive sensor signals Ssense (e.g., voltages Vtop and Vbot) from the MEMS element 11, perform signal processing thereon, and output the processed sensor signals as measurement signals Smeas at Signal Out. A readout circuit is provided between the MEMS element 11 and the signal processing circuit 20. The readout circuit receives signals from the MEMS element 11 and may include a biasing circuit (e.g., a resistive biasing circuit) for providing signals to the signal processing circuit 20. The readout circuit is shown in FIGS. 3A, 3B, 5A, 5B, and 6. The capacitive sensor 200 also includes a failure diagnosis circuit 30 that is configured to receive the sensor signals S sense and detect a one or more types of failures based thereon during a diagnosis operation. Failures may include capacitive failures or sensitivity failures of the MEMS element 11. In response to detecting a failure, the failure diagnosis circuit 30 is configured to generate an error signal Serr and output the error signal Serr at Error Out.

In order to detect an electrical failure, the failure diagnosis circuit 30 is configured to measure one of the electrical parameters affected by capacitive failures or sensitivity failures, compare the electrical parameter to a predetermined error threshold or to a predetermined tolerance range having minimum and maximum thresholds, and generate the error signal Serr in response to the electrical parameter crossing (e.g., exceeding) the predetermined error threshold or deviating outside the predetermined tolerance range. An electrical parameter affected by a capacitive failure may be measured RC time constants of capacitors CTop and CBot (e.g., with respect to Rbias1 and Rbias2, respectively) in response to a capacitive diagnosis injection signal. The RC time constants are proportional and thus representative of the capacitances of the CTop and CBot. An electrical parameter affected by a sensitivity failure may be a difference between measured RC time constants of a capacitor (i.e., CTop or CBot) in response to a sensitivity diagnosis injection signal. The difference between measured RC time constants in response to the sensitivity diagnosis injection signal corresponds to a voltage dependency of the capacitor, which in turn corresponds to the sensor sensitivity itself. A capacitive failure will result in a shift of the corresponding measured electrical parameter at the output of the MEMS element 11 to shift outside a predetermined tolerance range. Likewise, a sensitivity failure will result in a shift of the corresponding measured electrical parameter at the output of the MEMS element 11 to shift outside a predetermined tolerance range. The failure diagnosis circuit 30 is configured to monitor for and detect these types of failures during a diagnosis operation.

The error signal Serr may be provided to a further diagnostic circuit (not illustrated) configured to perform further analysis on the capacitive sensor 200 to determine the cause or the source of the failure.

The capacitive sensor 200 further includes a controller 40 configured to perform a diagnosis operation on the MEMS element 11. The controller 40 may be configured to generate a control signal Sreduce that is configured to control one or more circuit components at the input of the MEMS element 11 or at the output of the MEMS element 11 in order to reduce the sensor signal Ssense that may be caused by a sensed external forces, such as pressure or acceleration. The sensor signal S sense caused by an external force is reduced so that the electrical parameter of the targeted fault can be measured and evaluated. The methods of reducing the sensor signal Ssense include setting the input bias voltage Vbias applied to the input of the MEMS element 11 to zero, reducing the resistance values of bias resistors Rbias arranged at the output of the MEMS element 11 to increase the 3 dB frequency of the high-pass filter formed by Rbias and capacitors CTop and CBot, thus effectively filtering the sensor signal Ssense, or performing the read-out of the sensor signal S sense with a common mode buffer.

The controller 40 also includes a signal generator 50 configured to inject one or more diagnosis signals Sinject into the MEMS circuitry (i.e., either at the input or output thereof) after the sensor signal Ssense has been reduced by one or more of the above methods. The injected signal Sinject induces a response at the output of the capacitors CTop and CBot and the failure diagnosis circuit 30 is configured to measure the electrical parameters indicative of capacitive faults or sensitivity faults based on the response to the injected signal Sinject. It will be appreciated that while the signal generator 50 is shown as being integrated with the controller 40, the two could be separate elements.

The injected signal Sinject includes at least one electrical signal step (e.g., a voltage step or a current step). Thus, the injected signal Sinject is a stepped signal and an electrical signal step is a signal transition from one signal level to a second level which induces a response at the output of the capacitors CTop and CBot. The signal transition may be a step-up transition (i.e., a rising edge) or a step-down transition (i.e., a falling edge).

For testing for a capacitive and sensitivity faults, the controller 40 may transmit either the injected signal Sinject or timing information thereof indicative of an injection time or trigger time of the injected signal or a component thereof to the failure diagnosis circuit 30. In particular, the failure diagnosis circuit 30 detects a trigger time of an electrical step (i.e., a rising edge or a falling edge between two predefined signal levels) of the injected signal Sinject or receives this trigger time directly from the controller 40. Alternatively, the failure diagnosis circuit 30 may be integrated with the controller 50 such that it knows the trigger time automatically.

In either case, the failure diagnosis circuit 30 uses a trigger time of an electrical signal step of the injected signal to calculate relevant RC time constants. For example, an RC time constant may be calculated starting at a time a corresponding electrical step was triggered by the signal generator 50 to a time a measured signal reaches a predefined threshold value. Accordingly, the failure diagnosis circuit 30 receives information that indicates the trigger time of an electrical step.

The controller 40 may also control the predefined threshold value used by comparator circuitry for measuring RC time constants. The time constant is the amount of time it takes for a capacitor's transient response to change from a first supply value to a certain percentage of its second supply value. In other words, it is the amount of time it takes the voltage across the capacitor to change from one extrema to a certain percentage of its second extrema. The predefined threshold value is for the latter and represents the certain percentage of its second extrema. For example, the predefined threshold value may be set to approximately 63% of a maximum supply value on a rising response transient for one time constant and may be set to approximately 37% of a maximum supply value on a falling response transient for one time constant. Thus, the controller 40 may control the predefined threshold value used by the comparator circuitry for determining when the measured signal has reached a certain level after the trigger time for calculating the RC time constant.

Figure 3A:
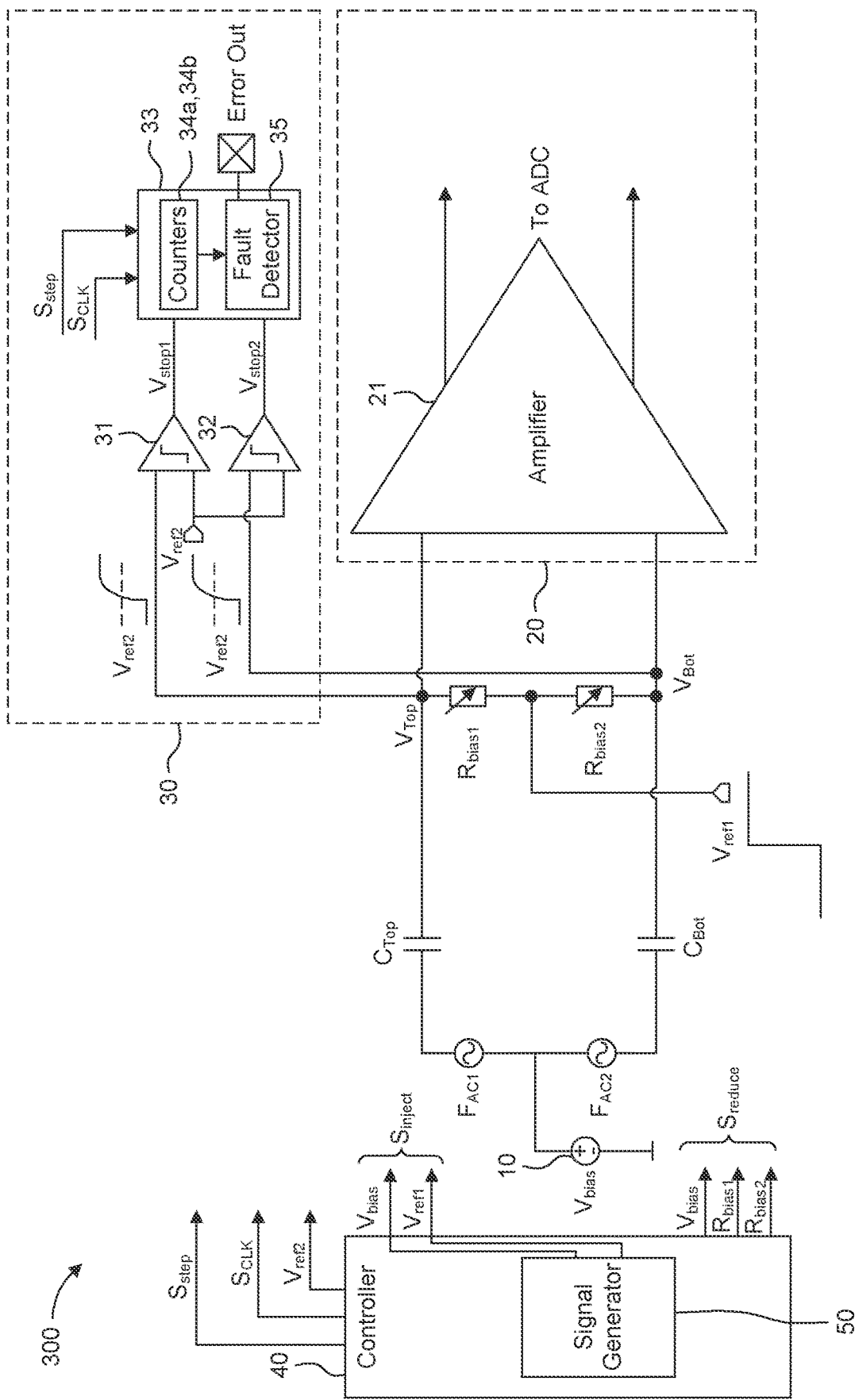
FIGS. 3A and 3B are schematic block diagrams of capacitive sensor read-out circuits according to one or more embodiments.
Figure 3B:
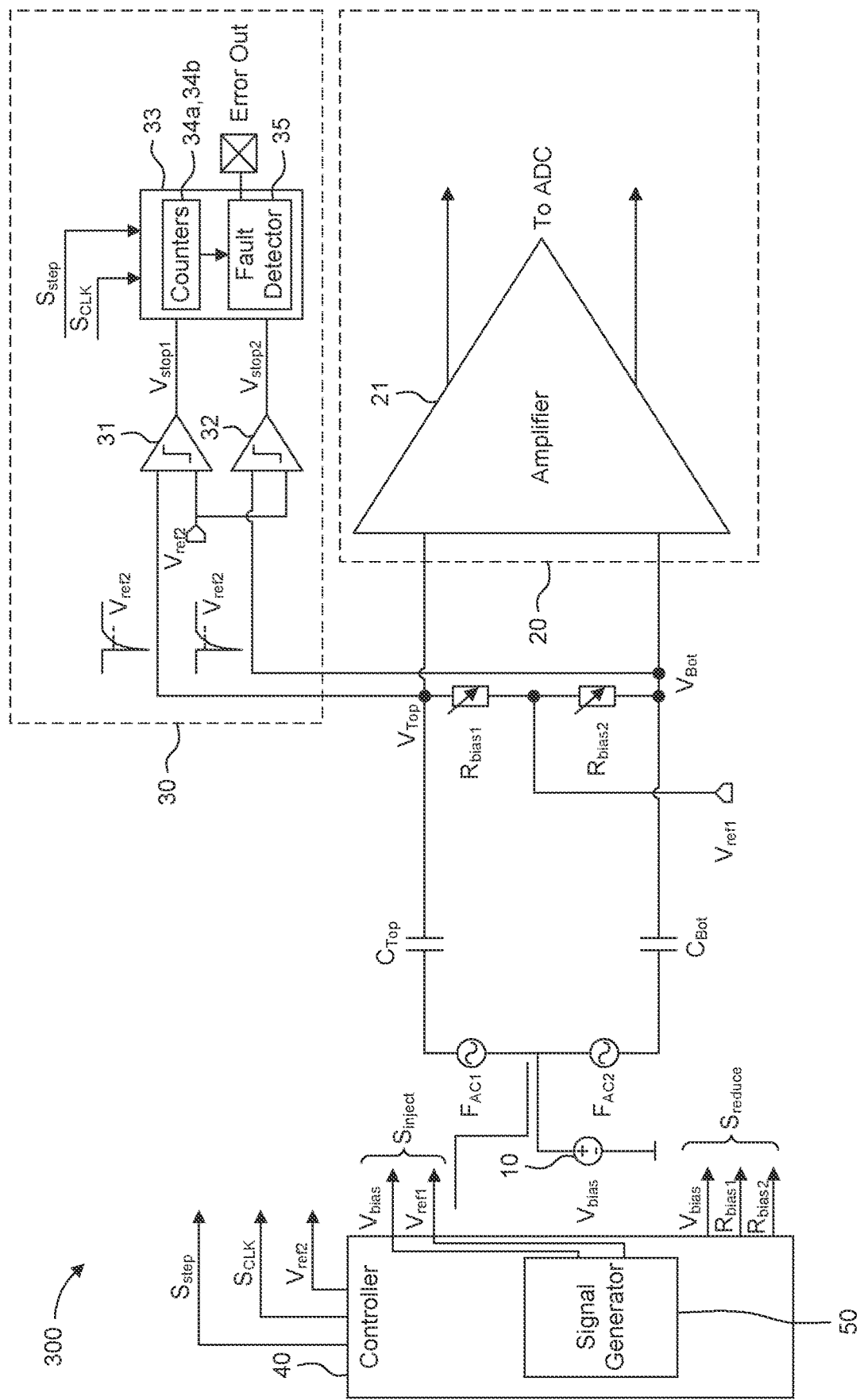

FIGS. 3A and 3B are schematic block diagrams of a capacitive sensor read-out circuit according to one or more embodiments. In particular, FIG. 3A shows a capacitive sensor read-out circuit 300 implementing one technique for detecting capacitive faults and FIG. 3B shows the capacitive sensor read-out circuit 300 implementing another technique for detecting capacitive faults. A difference between the three detection techniques includes a location of the injection node at which an injection signal (i.e., an electrical signal step) is injected that induces a response at Vtop and Vbot and/or the type of injection signal (e.g., a voltage signal or a current signal). The read-out circuit 300 is a constant charge (CC) read-out circuit for reading out signals of a capacitive MEMS element (e.g., MEMS element 11). Thus, the charge of each capacitor CTop and CBot is held constant while the voltage across the capacitors is varied based on the change in capacitance.

A DC bias voltage supply 10 supplies a DC bias voltage Vbias to the conductive structures (i.e., the back-plate(s) and membrane(s)) of the MEMS element. AC external forces $F_{AC1}$ and $F_{AC2}$ are representative of external forces (e.g., pressure or acceleration) being applied and acting on the conductive structures, thereby causing a change in capacitance at capacitors CTop and/or CBot.

An amplifier 21, such as a programmable-gain amplifier or a buffer amplifier, is configured to receive the voltages Vtop and Vbot from the MEMS element as sensor signals. The amplifier 21 is part of the signal processing circuit 20 and may be the beginning of a signal processing chain thereof. For example, the amplifier 21 may be configured to receive the sensor signals (i.e., voltages Vtop and Vbot) and provide amplified sensor signals to a discrete time ADC (not illustrated) that is arranged downstream along the signal processing chain of the signal processing circuit 20.

The voltages Vtop and Vbot at the MEMS element output is set via a very high-ohmic bias resistor Rbias1 and Rbias2, respectively, and a reference voltage Vref1. During a sensing operation, bias resistors Rbias1 and Rbias2 are set at a very high-ohmic value to reduce noise present at the inputs of the amplifier 21. For example, the bias resistors Rbias1 and Rbias2 may be initially set anywhere between 1 Gohm and 500 Gohms depending on the noise suppression requirements and bandwidth requirements of the readout circuit. The higher the resistance, the higher the noise suppression that provides higher SNR. However, it is conceivable that other resistances could be used. In this example, bias resistors Rbias1 and Rbias2 are maintained to be equal or substantially equal and may be adjustable in order to reduce the sensor signals so that capacitive and/or sensitivity faults can be tested and detected.

Reference voltage Vref1 is input at a common node between the two bias resistors Rbias1 and Rbias2. The Vtop and Vbot DC voltages at the MEMS output are set by the reference voltage Vref1, after a charging time given by the resistive value of Rbias1 and Rbias2 and the time constants of Ctop and Cbot. However, if a capacitive or sensitivity fault is present at one of the capacitors Ctop or Cbot, the time constants of Ctop and Cbot can be affected. For example, a larger capacitor typically has a longer transient response and thus a higher time constant. In contrast, a smaller capacitor typically has a shorter transient response and thus a lower time constant. Thus, the time constants of Ctop and Cbot can be measured and evaluated by the failure diagnosis circuit 30 to detect a capacitive or a sensitivity fault. In particular, the time constants of Ctop and Cbot can be measured by inducing a signal response at Vtop and Vbot, respectively, by an electrical signal step and measuring a rise time (i.e., a charging time) or a fall time (i.e., a discharging time) of Vtop and Vbot, respectively, against a corresponding time constant threshold value Vref2.

The capacitive sensor read-out circuit 300 includes the controller 40 and the signal generator 50 that generate various control signals and injection signals used to perform the fault diagnosis. The controller 40 generates control signals, including: a clock signal SCLK, a time constant threshold signal Vref2 that sets the time constant threshold value Vref2 to be used by threshold comparators 31 and 32, an electrical step timing signal Sstep that indicates a time an electrical step is triggered, a configuration signal Vbias that controls supply of the DC bias voltage supply 10 to the MEMS element 11, and configuration signals Rbias1 and Rbias2 that regulate (adjust) the resistive values of bias resistors Rbias1 and Rbias2.

The configuration signals Vbias, Rbias1, and Rbias2 are used as control signals Sreduce in order to reduce the sensor signal Ssense that may be caused by a sensed external forces, such as pressure or acceleration. The methods of reducing the sensor signal Ssense include setting the input bias voltage Vbias applied to the input of the MEMS element 11 to zero, reducing the resistance values of bias resistors Rbias1 and Rbias2 to increase the 3 dB frequency of the high-pass filter formed by Rbias and capacitors CTop and CBot, thus effectively filtering the sensor signal Ssense, or performing the read-out of the sensor signal Ssense with a common mode buffer (see FIG. 6).

The controller 40 may adjust the time constant threshold value Vref2 depending on the type of electrical signal step being injected and the injection point within the circuit. It is also noted that while the controller 40 is shown as supplying the clock signal SCLK, a system clock may also generate and supply the clock signal SCLK.

The signal generator 50 generates an injection signal Sinject that has an electrical signal step of either a step up or a step down. The injection signal Sinject can be applied as a voltage step at node Vref1 (see FIG. 3A), as a voltage step at the DC bias voltage supply 10 as Vbias (see FIG. 3B), or as a current step at nodes Vtop and Vbot (see FIG. 5A). Applying the injection signal Sinject at node Vref1 produces a low-pass filter time evolution in the transient response of the capacitors Ctop and Cbot. Applying the injection signal Sinject at the DC bias voltage supply 10 as Vbias produces a high-pass filter time evolution in the transient response of the capacitors Ctop and Cbot. If the voltage step is being applied at the DC bias voltage supply 10 as Vbias, then reducing the sensor signal Ssense should be employed by either reducing the resistance values of bias resistors Rbias1 and Rbias2 or by performing the read-out of the sensor signal S sense with a common mode buffer, as the sensor signal is maintained in a reduced state while the injection signal (i.e., the electrical signal step) is injected and the signal response evaluated by the failure diagnosis circuit 30.

Once the sensor signal Ssense is placed in a reduced state, the signal generator 50 generates an injection signal Sinject having an electrical signal step. In the example of FIG. 3A, the resistive values of Rbias1 and Rbias2 have been reduced to 100 kohms and an electrical signal step (i.e., a step-up) is injected at the node of Vref1. In other words, Vref1, acting as the injection signal, is increased by the signal generator 50 from a first voltage level to a second, higher voltage level and causes the capacitors Ctop and Cbot to start charging. As a result, an exponential signal increase at both outputs Vtop and Vbot of capacitors Ctop and Cbot is induced by the electrical signal step as a transient response.

The failure diagnosis circuit 30 includes a threshold comparator 31 that compares output voltage Vtop to a time constant threshold value Vref2 set by the system controller 40. The time constant threshold value Vref2 may be set to a voltage value that corresponds to a time constant of capacitor Ctop and Cbot, the capacitance of which should be of substantially equal value absent any faults. The threshold comparator 31 is configured to receive Vtop and Vref2 and change its output to Vstop1 when Vtop is equal to or greater than Vref2. For example, the threshold comparator 31 may change its output from 0V to 5V. The change in output indicates that capacitor Ctop charged to a point in response to the injection signal that Vtop crossed the time constant threshold value Vref2, which represents the time constant of capacitor Ctop. The output of Vstop1 stops a counter 34a that is assigned to capacitor Ctop and is used for measuring the time constant thereof.

Similarly, the failure diagnosis circuit 30 includes a threshold comparator 32 that compares output voltage Vbot to the time constant threshold value Vref2 set by the system controller 40. The threshold comparator 31 is configured to receive Vbot and Vref2 and change its output when Vbot is equal to or greater than Vref2. The threshold comparator 32 is configured to receive Vbot and Vref2 and change its output to Vstop2 when Vbot is equal to or greater than Vref2. For example, the threshold comparator 32 may change its output from 0V to 5V. The change in output indicates that capacitor Cbot charged to a point in response to the injection signal that Vbot crossed the time constant threshold value Vref2, which represents the time constant of capacitor Cbot. The output of Vstop2 stops a counter 34b that is assigned to capacitor Cbot and is used for measuring the time constant thereof.

The failure diagnosis circuit 30 further includes a processing circuit 33 that includes a counters 34a, 34b that operate (i.e., count up) based on the clock signal SCLK. The counters 34a, 34b start at the time the electrical signal step is triggered. Thus, electrical step timing signal Sstep is a counter start signal received by the counters 34a, 34b to trigger the counters 34a, 34b to start counting.

Counter 34a is configured to stop counting when threshold comparator 31 outputs voltage Vstop1, indicating that Vtop crossed the time constant threshold value Vref2. The timed value of counter 34a at the time voltage Vstop1 is received represents the time constant TCtop of capacitor Ctop. Counter 34b is configured to stop counting when threshold comparator 32 outputs voltage Vstop2, indicating that Vbot crossed the time constant threshold value Vref2. The timed value of counter 34b at the time voltage Vstop2 is received represents the time constant TCbot of capacitor Cbot.

The processing circuit 33 of the failure diagnosis circuit 30 includes a fault detector 35 that is configured to compare both measured time constants TCtop and TCbot (e.g., final count values of the counters) to a predetermined threshold range comprising a minimum threshold value TCmin and a maximum threshold value TCmax according to Equations 1 and 2. The minimum threshold value TCmin may be set to be greater than zero. The minimum and maximum thresholds may be set to be within a certain percentage of the expected time constant (e.g., within 10%). If the fault detector 35 determines that either of the time constants TCtop and TCbot are outside of the predetermined threshold range (i.e., less than the minimum threshold value TCmin or greater than the maximum threshold value TCmax), the fault detector 35 generates an error signal indicating a capacitive fault. Otherwise, the fault detector 35 determines that no capacitive fault is present at either capacitor Ctop or Cbot and may output a "no fault" signal. The error signal may which time constant exceeded the limits of the predetermined threshold range, thereby indicating the capacitor that has the fault.

$$TCmin \leq TCtop \leq TCmax \qquad \text{Eq. 1}$$

$$TCmin \leq TCbot \leq TCmax \qquad \text{Eq. 2}$$

In the example of FIG. 3B, the resistive values of Rbias1 and Rbias2 have again been reduced to 100 kohms to place the sensor signals in a reduced state. However, an electrical signal step (i.e., a step-down) is injected at the DC power supply via input voltage Vbias. In other words, Vbias, acting as the injection signal, is decreased by the signal generator 50 from a first voltage level to a second, lower voltage level and causes a signal response at the output of capacitors Ctop and Cbot. As a result, an exponential signal increase at both outputs Vtop and Vbot of capacitors Ctop and Cbot is induced by the electrical signal step as a transient response.

The failure diagnosis circuit 30 monitors the values of outputs Vtop and Vbot during their transient response in a similar manner described above for FIG. 3A.

Figure 4A:
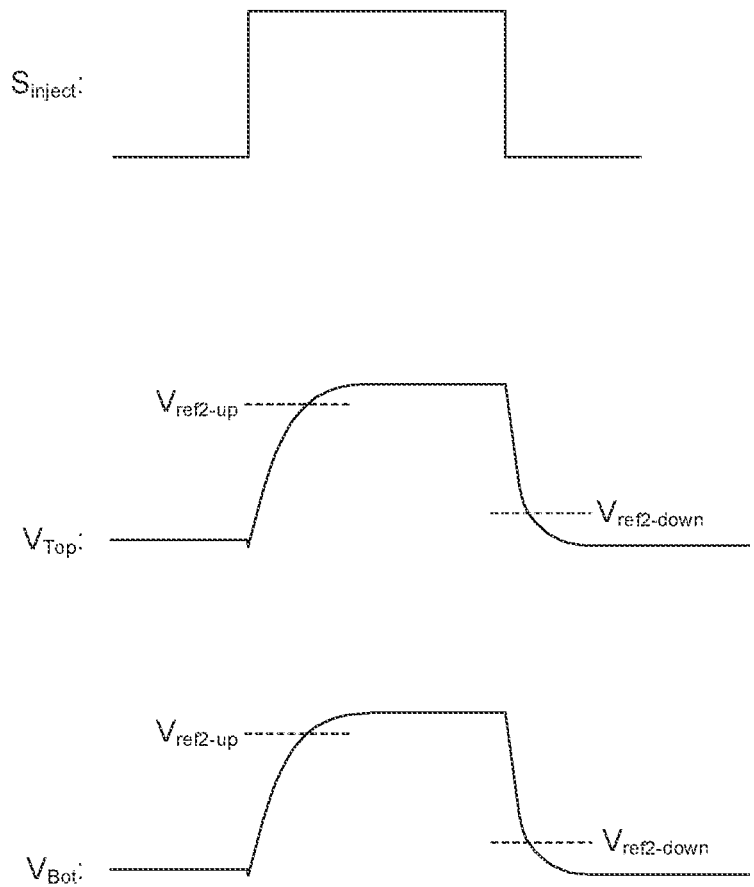
FIGS. 4A and 4B are signal diagrams derived from the capacitive sensor read-out circuits of FIGS. 3A and 3B, respectively.

By applying the injection signal as a two-step electrical signal, instead of as a one-step electrical signal, the capacitive sensor read-out circuit 300 of FIGS. 3A and 3B can also be used to test for sensitivity faults. As used herein, a two-step electrical signal includes an electrical step up from a first signal level to a second signal level and an electrical step down from the second signal level to the first signal level. The triggering of the two electrical signal steps is separated by a predetermined amount of time, as controlled by the controller 40. As before, one of the above-described methods used to place the sensor signal in a reduced state is implemented prior to applying the two-step electrical signal FIG. 4A is a signal diagram of various signals present in the capacitive sensor read-out circuit 300 of FIG. 3A for testing sensitivity faults according to one or more embodiments. The signals includes a two-step electrical signal Sinject that is injected by the signal generator 50 at node Vref1, the transient response of output voltage Vtop in response to the two-step electrical signal Sinject, and the transient response of output voltage Vbot in response to the two-step electrical signal Sinject.

As before, the failure diagnosis circuit 30 uses threshold comparators 31 and 32 and counters 34a and 34b to measure the time constants of the capacitors Ctop and Cbot. However, since the injection signal Sinject is a two-step electrical signal, the failure diagnosis circuit 30 is configured to measure the time constants of the capacitors Ctop and Cbot for each electrical signal step. As a result, the failure diagnosis circuit 30 will determine a first time constant TCtop1 for the electrical step up and a second time constant TCtop2 for the electrical step down for capacitor Ctop. Likewise, the failure diagnosis circuit 30 will determine a first time constant TCbot1 for the electrical step up and a second time constant TCbot2 for the electrical step down for capacitor Cbot.

Because the time constant threshold value Vref2 is different for measuring a time constant for a voltage rise than for measuring a time constant for a voltage fall, the time constant threshold value Vref2 needs to be adjusted for each electrical signal step. The controller 40 may be configured to adjust the time constant threshold value Vref2 according to the different signal steps. For example, the controller 40 may set the time constant threshold value Vref2 to a value Vref2_up for an increasing transient response and may set the time constant threshold value Vref2 to a value Vref2_down for a decreasing transient response. The values value Vref2_up and Vref2_down may be set to approximately 63% of the final voltage value of the capacitor during a charge or discharge step. The controller 40 may set the time constant threshold value Vref2 to the appropriate value at, for example, the time the corresponding electrical signal step is triggered.

The threshold comparator 31 generates a counter stop value when Vtop becomes equal to or greater than Vref2_up in response to an electrical step up and generates a counter stop value when Vtop becomes equal to or less than Vref2_down in response to an electrical step down. Likewise, the threshold comparator 32 generates a counter stop value when Vbot becomes equal to or greater than Vref2_up in response to an electrical step up and generates a counter stop value when Vbot becomes equal to or less than Vref2_down in response to an electrical step down. The counter values at counters 34a and 34b represent the corresponding time constants TCtop1, TCtop2, TCbot1, and TCbot2.

The difference between the two measured time constants of a capacitor Ctop or Cbot can be used to detect a sensitivity fault for that capacitor. For example, the fault detector 35 can calculate the difference between time constants and compare the difference to a predetermined difference threshold range comprising a minimum difference threshold value $\Delta TCmin$ and a maximum difference threshold value $\Delta TCmax$ according to Equations 3-6.

$$\Delta TCtop = |TCtop1 - TCtop2| \qquad \text{Eq. 3}$$

$$\Delta TCbot = |TCbot1 - TCbot2| \qquad \text{Eq. 4}$$

$$\Delta TCmin \leq \Delta TCtop \leq \Delta TCmax \qquad \text{Eq. 5}$$

$$\Delta TCmin \leq \Delta TCbot \leq \Delta TCmax \qquad \text{Eq. 6}$$

The minimum and maximum thresholds may be set to be within a certain percentage of an expected difference threshold value (e.g., within 10%). If the fault detector 35 determines that either of the differential time constants $\Delta TCtop$ and $\Delta TCbot$ are outside of the predetermined difference threshold range (i.e., less than the minimum threshold value $\Delta TCmin$ or greater than the maximum threshold value $\Delta TCmax$), the fault detector 35 generates an error signal indicating a sensitivity fault. Otherwise, the fault detector 35 determines that no sensitivity fault is present at either capacitor Ctop or Cbot and may output a "no fault" signal. The error signal may identify which differential time constant exceeded the limits of the predetermined difference threshold range, thereby indicating the capacitor that has the fault.

Figure 4B:
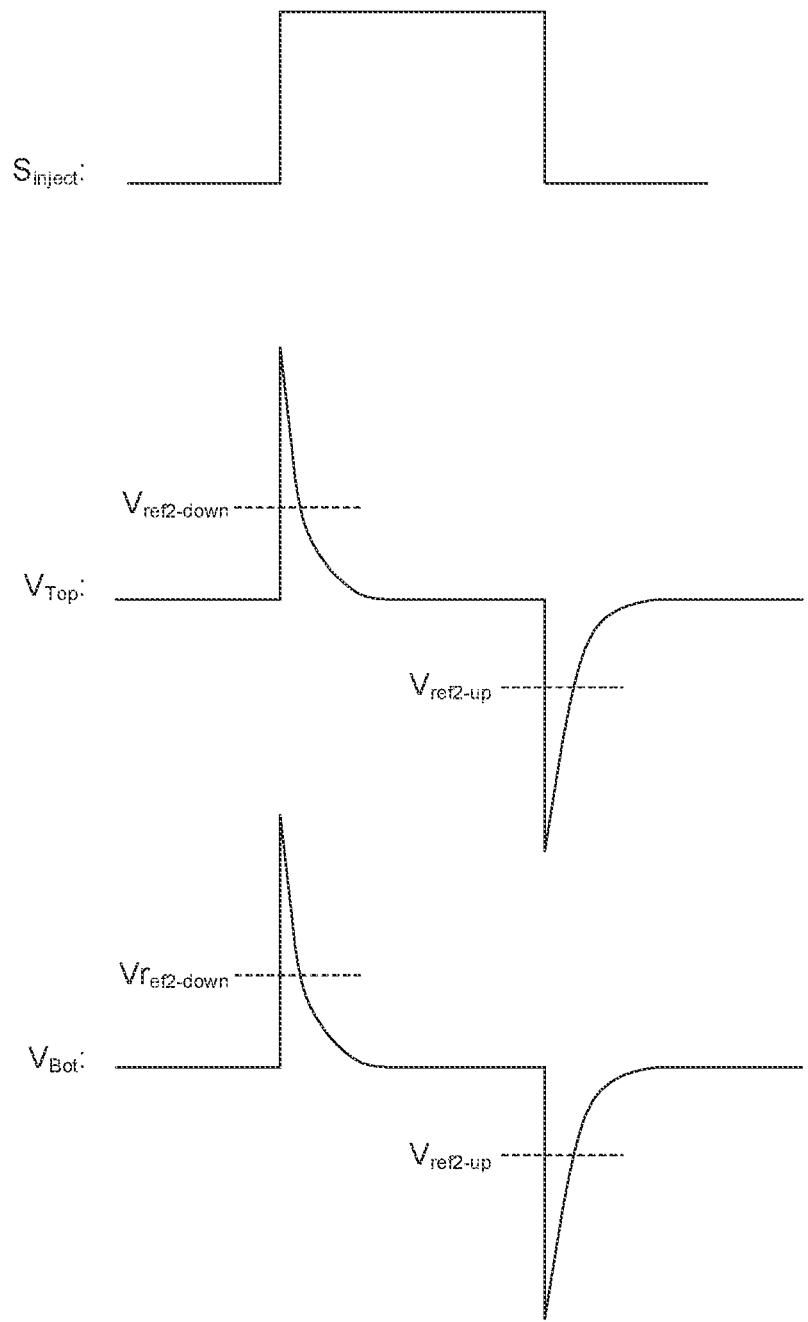

FIG. 4B is a signal diagram of various signals present in the capacitive sensor read-out circuit 300 of FIG. 3BA for testing sensitivity faults according to one or more embodiments. The signals includes a two-step electrical signal Sinject that is injected by the signal generator 50 at the DC bias voltage supply 10 via Vbias, the transient response of output voltage Vtop in response to the two-step electrical signal Sinject, and the transient response of output voltage Vbot in response to the two-step electrical signal Sinject.

Because the time constant threshold value Vref2 is different for measuring a time constant for a voltage rise than for measuring a time constant for a voltage fall, the time constant threshold value Vref2 needs to be adjusted for each electrical signal step. The controller 40 may set the time constant threshold value Vref2 to a value Vref2_up for an increasing transient response and may set the time constant threshold value Vref2 to a value Vref2_down for a decreasing transient response.

The failure diagnosis circuit 30 performs similar measurements as described above in reference to FIG. 4A to determine the corresponding time constants TCtop1, TCtop2, TCbot1, and TCbot2 and then performs a fault evaluation according to Equations 3-6.

Figure 5A:
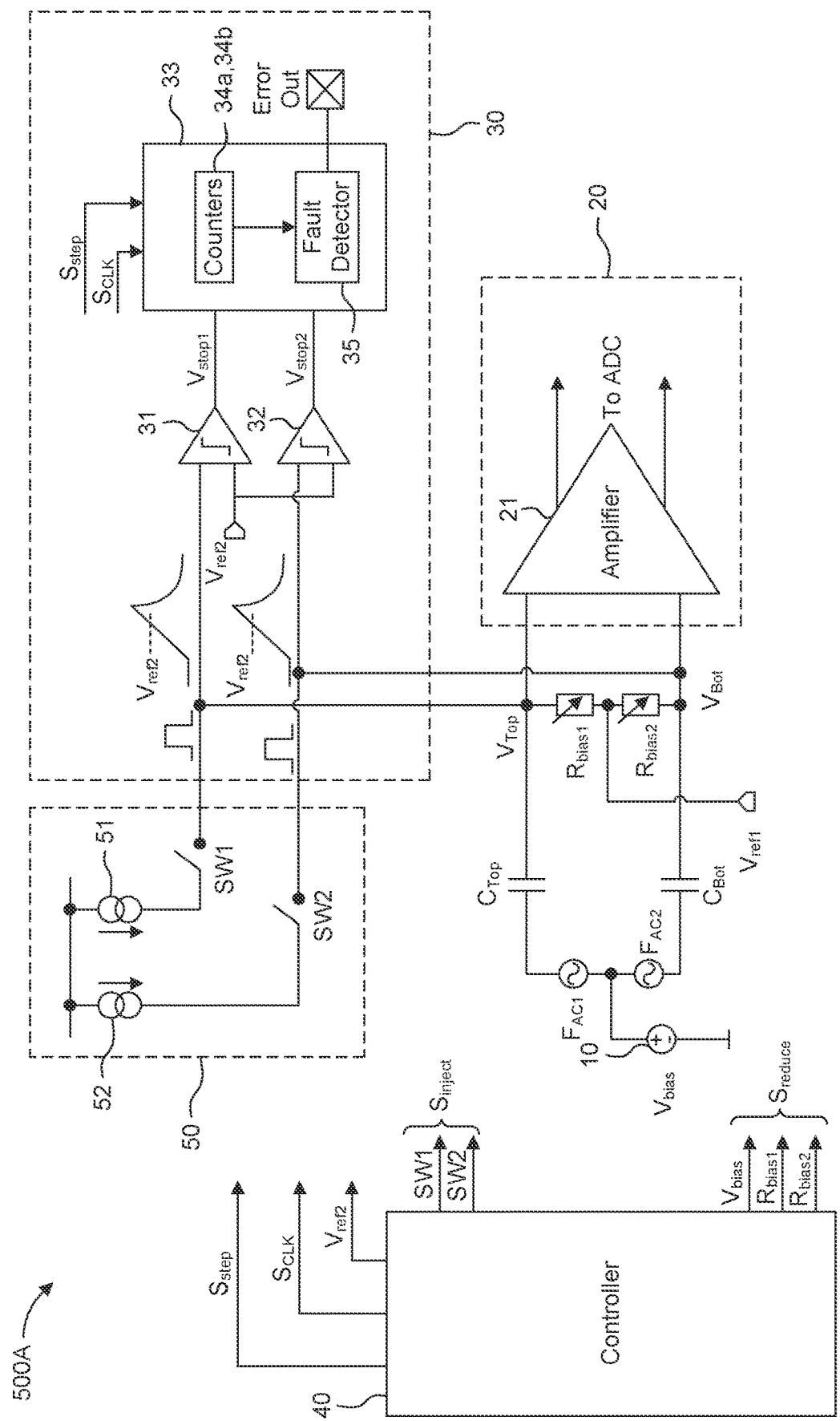
FIGS. 5A and 5B are schematic block diagram of another capacitive sensor read-out circuit according to one or more embodiments.

FIG. 5A shows the capacitive sensor read-out circuit 500A implementing another technique for detecting capacitive faults. The capacitive sensor read-out circuit 500A is similar to capacitive sensor read-out circuit 300 except that the signal generator 50 configured to inject current signals instead of voltage signals as the electrical signal step in order to induce a transient voltage response at capacitors Ctop and Cbot. The function of the failure diagnosis circuit 30 is the same as previously described in reference to the capacitive sensor read-out circuit 300.

In the example of FIG. 5A, the sensor signals are placed in a reduced state by one of the above-described methods. In this example, the signal generator 50 is implemented as two current sources 51 and 52 and two switches SW1 and SW2 that are configured to inject a current step at nodes Vtop and Vbot. The switches SW1 and SW2 are controlled by the controller 40 that opens or closes the switches, for example, synchronously via corresponding injection control signals Sinject (SW1 and SW2). The current steps at nodes Vtop and Vbot when the switches SW1 and SW2 are closed induces a linear increase (i.e., a linear charging) of the voltages Vtop and Vbot across capacitors Ctop and Cbot. The rise time of voltages Vtop and Vbot can be monitored as similarly described above in order to determine the time constants TCtop and TCbot of capacitors Ctop and Cbot, respectively. The failure diagnosis circuit 30 compares the time constants TCtop and TCbot to the predetermined threshold range in a similar manner described above for FIG. 3A in order to determine whether a capacitive fault is present. When the switches SW1 and SW2 are reopened, an exponential discharge of the capacitors Ctop and Cbot occurs due to bias resistors Rbias1 and Rbias2.

Figure 5B:
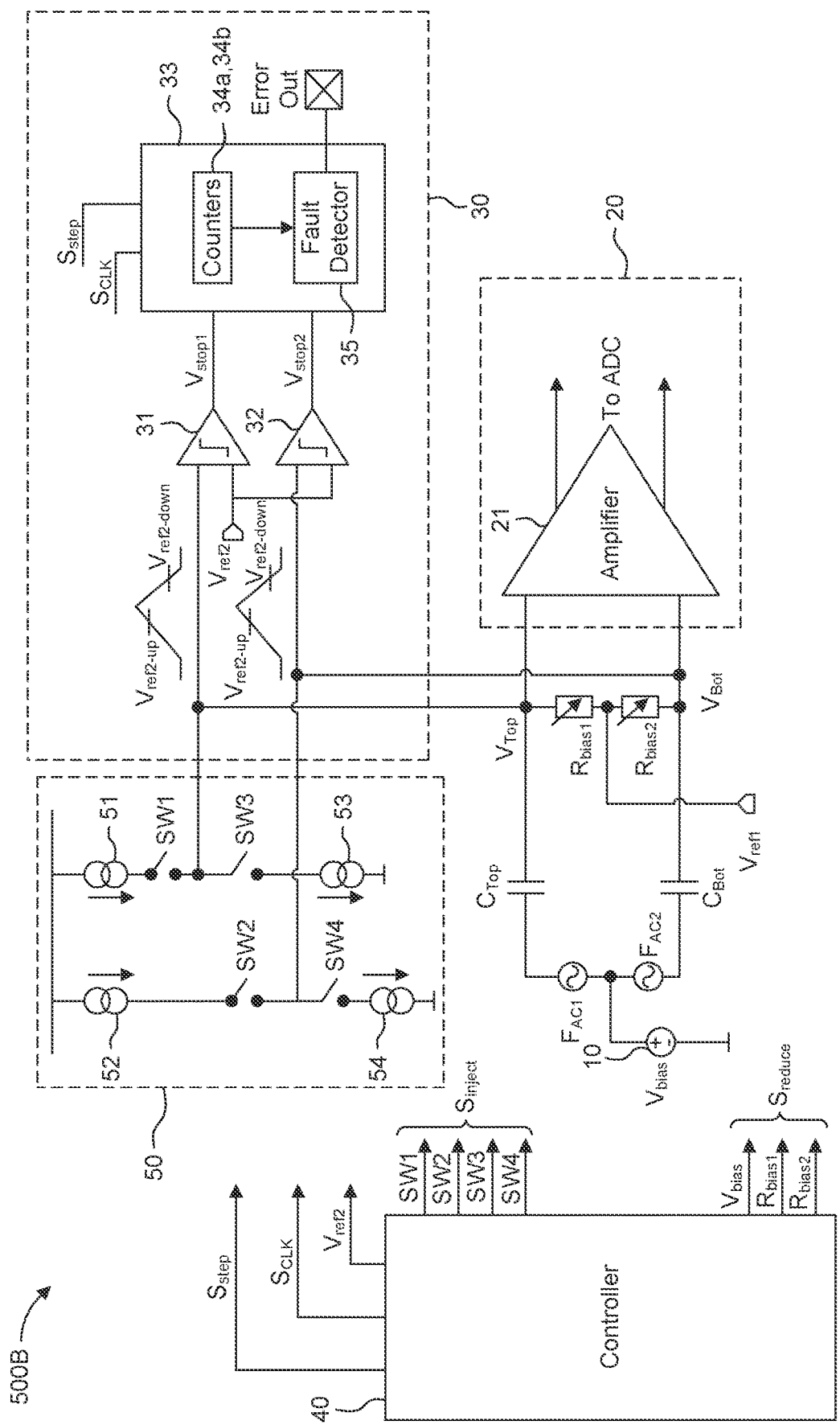

FIG. 5B shows the capacitive sensor read-out circuit 500B implementing another technique for detecting sensitivity faults. In this example, the signal generator 50 is implemented as four current sources/sinks 51-54 and four switches SW1-SW4. Current sources 51 and 52 are configured to source a current step at nodes Vtop and Vbot when switches SW1 and SW2 are closed. Current sinks 53 and 54 are configured to sink a current step from nodes Vtop and Vbot when switches SW3 and SW4 are closed. A two-step electrical signal can be generated by first using current sources 51 and 52 to generate a first current step where switches SW1 and SW2 are synchronously closed and switches SW3 and SW4 are synchronously open and then using current sinks 53 and 54 to generate a second current step where switches SW1 and SW2 are synchronously open and switches SW3 and SW4 are synchronously closed. The controller 40 is configured to control the state of the switches SW1-SW4 via corresponding injection control signals Sinject (SW1-SW4).

The current steps at nodes Vtop and Vbot when the switches SW1 and SW2 are closed induces a linear increase (i.e., a linear charging) of the voltages Vtop and Vbot across capacitors Ctop and Cbot. The rise time of voltages Vtop and Vbot can be monitored as similarly described above in order to determine the time constants TCtop1 and TCbot1 of capacitors Ctop and Cbot, respectively. The current steps at nodes Vtop and Vbot when the switches SW3 and SW4 are closed induces a linear decrease (i.e., a linear discharging) of the voltages Vtop and Vbot across capacitors Ctop and Cbot. The fall time of voltages Vtop and Vbot can be monitored as similarly described above in order to determine the time constants TCtop2 and TCbot2 of capacitors Ctop and Cbot, respectively. The controller 40 also adjusts the value at Vref2 between Vref2_up and Vref2_down based on whether the transient response being induced by a signal step is an increasing (charging) or decreasing (discharging) transient response as similarly described in conjunction with FIGS. 4A and 4B.

The function of the failure diagnosis circuit 30 is the same as previously described in reference to the capacitive sensor read-out circuit 300 and the detection of sensitivity faults described in conjunction with FIGS. 4A and 4B.

The capacitive sensor read-out circuit 500B may also be used to test both capacitive faults by only using current sources 51 and 52 (i.e., by keeping switches SW3 and SW4 open and the current sinks 53 and 54 disconnected). In this way, the single electrical step injection signal can be generated as described in FIG. 5A.

Figure 6:
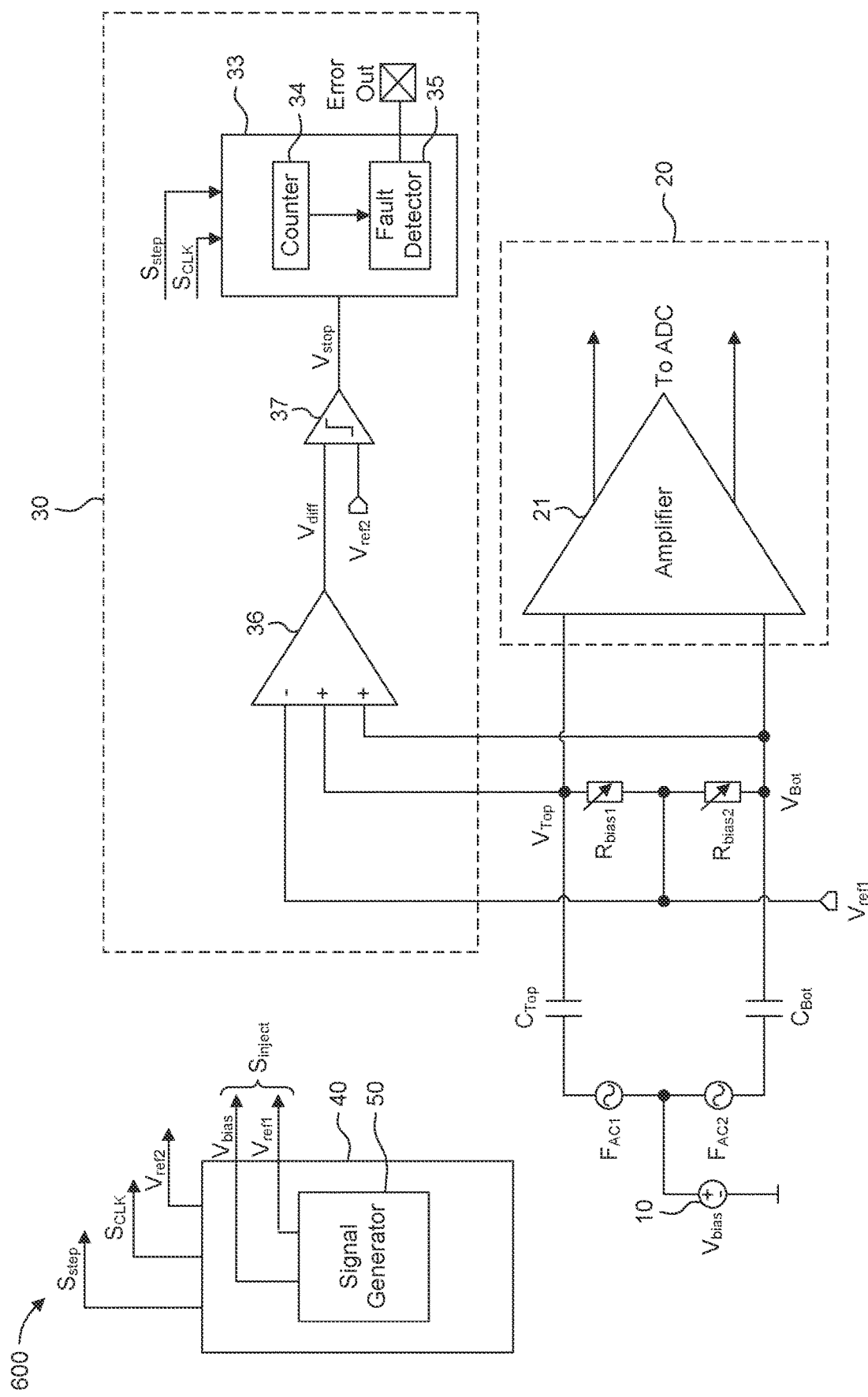
FIG. 6 is a schematic block diagram of another capacitive sensor read-out circuit according to one or more embodiments.

FIG. 6 is a schematic block diagram of a capacitive sensor read-out circuit 600 according to one or more embodiments. In particular, the capacitive sensor read-out circuit 600 includes a common mode buffer 36 that performs the sensor signal readout for fault diagnosis. By using the common mode buffer 36 in this manner, the sensor signal Ssense is always placed in a reduced state at the fault diagnosis circuit 30. Thus, the signal Sreduce is not needed.

The common mode buffer 36 includes two input terminals that are electrically connected to DC voltages Vtop and Vbot, respectively. The common mode buffer 36 is configured to generate an averaged signal internally that represents the average of these two inputs (i.e., the average of voltages Vtop and Vbot). The common mode amplifier 36 also includes an input terminal electrically connected to the common mode voltage Vref1 (i.e., the node coupled between the bias resistors Rbias1 and Rbias2). The common mode buffer 36 is configured to generate a differential output signal Vdiff that represents the difference between the averaged signal (i.e., the common mode between Vtop and Vbot) and the common mode reference signal (i.e., common mode voltage Vref1).

The signal generator 50 is configured to apply a single-step or two-step electrical injection signal in any manner described above, for example, by applying the signal at Vbias or Vref1. An electrical signal step induces a transient response at the differential output signal Vdiff of the common mode buffer 36 that can be evaluated in order to determine an averaged time constant of capacitors Ctop and Cbot. The fault diagnosis circuit 30 includes a threshold comparator 37 that receives the differential output signal Vdiff and the time constant threshold value Vref2, and generates a counter stop signal Vstop when Vdiff becomes equal to or greater than Vref2. The counter stop signal Vstop stops the counter 34 of the processing circuit 33 that was started by the electrical step timing signal Sstep at the time the electrical signal step was triggered. The counter value of the counter 34 at the time it is stopped represents the average time constant of capacitors Ctop and Cbot. The fault detector 35 compares the measured average time constant to a predetermined threshold range in order to determine whether or not a fault is present in accordance with the above-described embodiments.

While various embodiments have been described, it will be apparent to those of ordinary skill in the art that many more embodiments and implementations are possible within the scope of the disclosure. Accordingly, the invention is not to be restricted except in light of the attached claims and their equivalents.

With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

In summary, although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A capacitive sensor, comprising:
a first conductive structure;
a second conductive structure that is counter to the first conductive structure, wherein the second conductive structure is movable relative to the first conductive structure in response to an external force acting thereon, wherein the second conductive structure is capacitively coupled to the first conductive structure to form a first capacitor having a first capacitance that changes with a change in a distance between the first conductive structure and second conductive structure, wherein the first capacitance is representative of the external force;
a signal generator configured to apply a first electrical signal step at an input or at an output of the first capacitor to induce a first voltage transient response at the output of the first capacitor; and
a diagnostic circuit configured to detect a fault in the capacitive sensor by calculating a first time constant of the first voltage transient response and detecting the fault based on the first time constant,
wherein the first time constant is calculated based on a time the first electrical signal step is triggered by the signal generator to a time a measured signal reaches a predefined threshold value.

2. The capacitive sensor of claim 1, wherein the first electrical signal step causes the first capacitor to charge to a maximum voltage or to discharge to a minimum voltage.

3. The capacitive sensor of claim 1, wherein the first electrical signal step is a step-up or a step-down signal step.

4. The capacitive sensor of claim 1, wherein:
the diagnostic circuit comprises a comparator, a counter, and a fault detector,
the comparator is configured to receive an output voltage representative of the first voltage transient response and compare the output voltage to a reference threshold in order to generate a comparison result having one of two comparator values,
the counter is configured to stop counting when the comparison result changes from a first comparator value to a second comparator value and output a stopped counter value representative of the first time constant, and
the fault detector is configured to compare the stopped counter value to a predetermined threshold range and generate an error signal in response to the stopped counter value being outside the predetermined threshold range.

5. The capacitive sensor of claim 1, wherein:
the diagnostic circuit comprises a comparator and a fault detector,
the comparator is configured to receive an output voltage representative of the first voltage transient response, and compare the output voltage to a reference threshold in order to detect the first time constant, and
the fault detector is configured to compare the first time constant to a predetermined threshold range and generate an error signal in response to the first time constant being outside the predetermined threshold range.

6. The capacitive sensor of claim 5, wherein the diagnostic circuit comprises a counter configured to output a first counter value representative of the detected first time constant and the fault detector is configured to compare the first counter value to the predetermined threshold range and generate the error signal in response to the first counter value being outside the predetermined threshold range.

7. The capacitive sensor of claim 1, wherein:
the diagnostic circuit is configured to compare the first time constant to a predetermined threshold range and generate an error signal in response to the first time constant being outside the predetermined threshold range.

8. The capacitive sensor of claim 7, wherein the predetermined threshold range comprises a minimum threshold value and a maximum threshold value, and the first time constant is outside the predetermined threshold range if it is less than the minimum threshold value or greater than the maximum threshold value.

9. The capacitive sensor of claim 1, wherein:
the signal generator is configured to apply a second electrical signal step at the input or at the output of the first capacitor to induce a second voltage transient response at the output of the first capacitor, wherein the second voltage transient response is in a direction opposite to the first voltage transient response, and
the diagnostic circuit is configured to detect the fault in the capacitive sensor by measuring a second time constant of the second voltage transient response and detecting the fault based on the first time constant and the second time constant.

10. The capacitive sensor of claim 9, wherein the diagnostic circuit is configured to calculate a difference between the first time constant and the second time constant, compare a magnitude of the difference to a predetermined threshold range, and generate an error signal in response to the magnitude of the difference being outside the predetermined threshold range.

11. The capacitive sensor of claim 9, wherein:
the diagnostic circuit comprises a comparator, at least one counter, and a fault detector,
the comparator is configured to receive an output voltage representative of the first voltage transient response and the second voltage transient response, compare the output voltage to a first reference threshold in order to detect the first time constant, and compare the output voltage to a second reference threshold in order to detect the second time constant,
the at least one counter is configured to output a first counter value representative of the detected first time constant and output a second counter value representative of the detected second time constant, and
the fault detector is configured to calculate a difference between the first counter value and the second counter value, compare a magnitude of the difference to a predetermined threshold range, and generate an error signal in response to the magnitude of the difference being outside the predetermined threshold range.

12. The capacitive sensor of claim 1, further comprising:
a third conductive structure that is counter to the first conductive structure, wherein the third conductive structure is movable relative to the first conductive structure, wherein the third conductive structure is capacitively coupled to the first conductive structure to form a second capacitor having a second capacitance that changes with a change in a distance between the first conductive structure and third conductive structure,
wherein the signal generator is configured to apply the first electrical signal step at an input or at an output of the second capacitor to induce a second voltage transient response at the output of the second capacitor; and a diagnostic circuit configured to detect the fault in the capacitive sensor by measuring a second time constant of the second voltage transient response and detecting the fault based on the first time constant and the second time constant.

13. The capacitive sensor of claim 12, wherein the signal generator is configured to apply the first electrical signal step simultaneously to the first capacitor and the second capacitor such that the first voltage transient response and the second voltage transient response are induced by the same electrical signal step.

14. The capacitive sensor of claim 12, wherein:
the diagnostic circuit is configured to compare the first time constant and the second time constant to a predetermined threshold range and generate an error signal in response to either the first time constant being outside the predetermined threshold range or the second time constant being outside the predetermined threshold range.

15. The capacitive sensor of claim 12, wherein:
the signal generator is configured to apply a second electrical signal step at the input or at the output of the first capacitor to induce a third voltage transient response at the output of the first capacitor, wherein the third voltage transient response is in a direction opposite to the first voltage transient response,
the signal generator is configured to apply the second electrical signal step at the input or at the output of the second capacitor to induce a fourth voltage transient response at the output of the second capacitor, wherein the fourth voltage transient response is in a direction opposite to the second voltage transient response, and
the diagnostic circuit is configured to detect the fault in the capacitive sensor by measuring a third time constant of the third voltage transient response, measuring a fourth time constant of the fourth voltage transient response, and detecting the fault based on the first, the second, the third, and the fourth time constants.

16. The capacitive sensor of claim 15, wherein the diagnostic circuit is configured to calculate a first difference between the first time constant and the third time constant, compare a magnitude of the first difference to a predetermined threshold range, calculate a second difference between the second time constant and the fourth time constant, compare a magnitude of the first difference to a predetermined threshold range, compare a magnitude of the second difference to the predetermined threshold range, and generate an error signal in response to the magnitude of the first difference being outside the predetermined threshold range or in response to the magnitude of the second difference being outside the predetermined threshold range.

17. The capacitive sensor of claim 1, further comprising a controller,
wherein the first capacitor comprises a first terminal coupled to a bias supply voltage and a second terminal coupled to a DC voltage set by a bias resistive circuit, and
wherein the controller is configured to drive the bias supply voltage to zero and control the signal generator to apply the first electrical signal step at the output of the first capacitor to induce the first voltage transient response while the bias supply voltage is zero.

18. The capacitive sensor of claim 1, further comprising a controller,
wherein the first capacitor comprises a first terminal coupled to a bias supply voltage and a second terminal coupled to a DC voltage set by a bias resistive circuit, and
wherein the controller is configured to decrease a resistance of the bias resistive circuit and control the signal generator to apply the first electrical signal step at the input or the output of the first capacitor to induce the first voltage transient response while the resistance of the bias resistive circuit is reduced.

19. A capacitive sensor, comprising:
a first conductive structure;
a second conductive structure that is counter to the first conductive structure, wherein the second conductive structure is movable relative to the first conductive structure, wherein the second conductive structure is capacitively coupled to the first conductive structure to form a first capacitor having a first capacitance that changes with a change in a distance between the first conductive structure and second conductive structure, wherein the first capacitor comprises a first terminal coupled to a bias supply voltage and a second terminal coupled to a first DC voltage set by a bias resistive circuit;
a third conductive structure that is counter to the first conductive structure, wherein the third conductive structure is movable relative to the first conductive structure, wherein the third conductive structure is capacitively coupled to the first conductive structure to form a second capacitor having a second capacitance that changes with a change in a distance between the first conductive structure and third conductive structure, wherein the second capacitor comprises a first terminal coupled to the bias supply voltage and a second terminal coupled to a second DC voltage set by the bias resistive circuit;
a common mode buffer configured to receive the first DC voltage, the second DC voltage, and a reference voltage, and generate a differential signal based on a difference between a common mode voltage of the first DC voltage and the second DC voltage and the reference voltage;
a signal generator configured to apply a first electrical signal step at an input or at an output of the first capacitor and at an input or at an output of the second capacitor to induce a first voltage transient response in the first DC voltage and to induce a second voltage transient response in the second DC voltage, respectively; and
a diagnostic circuit configured to detect a fault in the capacitive sensor by measuring a first time constant of the differential signal that corresponds to the first and the second voltage transient responses and detect the fault based on the first time constant.

20. The capacitive sensor of claim 19, wherein:
the diagnostic circuit is configured to compare the first time constant to a predetermined threshold range and generate an error signal in response to the first time constant being outside the predetermined threshold range.

21. The capacitive sensor of claim 19, wherein:
the signal generator is configured to apply a second electrical signal step at the input or at the output of the first capacitor to induce a third voltage transient response in the first DC voltage, wherein the third voltage transient response is in a direction opposite to the first voltage transient response,
the signal generator is configured to apply the second electrical signal step at the input or at the output of the second capacitor to induce a fourth voltage transient response in the second DC voltage, wherein the fourth voltage transient response is in a direction opposite to the second voltage transient response, and
the diagnostic circuit is configured to detect the fault in the capacitive sensor by measuring a second time constant of the differential signal that corresponds to the third and the fourth voltage transient responses and detect the fault based on the first time constant and the second time constant.

22. The capacitive sensor of claim 21, wherein the diagnostic circuit is configured to calculate a difference between the first time constant and the second time constant, compare a magnitude of the difference to a predetermined threshold range, and generate an error signal in response to the magnitude of the difference being outside the predetermined threshold range.

* * * * *

UNITED STATES PATENT AND TRADEMARK OFFICE
CERTIFICATE OF CORRECTION

| | | |
|---|---|---|
| PATENT NO. | : 11,953,533 B2 | |
| APPLICATION NO. | : 17/347776 | |
| DATED | : April 9, 2024 | |
| INVENTOR(S) | : Dan-Ioan-Dumitru Stoica | |

It is certified that error appears in the above-identified patent and that said Letters Patent is hereby corrected as shown below:

On the Title Page

Item (73) Assignee, Please change "Capital One Services, LLC" to --Infineon Technologies AG--.

Signed and Sealed this
Twelfth Day of November, 2024

Katherine Kelly Vidal
*Director of the United States Patent and Trademark Office*